(12) United States Patent
Ahles et al.

(10) Patent No.: US 11,664,215 B2
(45) Date of Patent: May 30, 2023

(54) HIGH SELECTIVITY ATOMIC LATER DEPOSITION PROCESS

(71) Applicant: Applied Materials, Inc., Santa Clara, CA (US)

(72) Inventors: Christopher Ahles, San Diego, CA (US); Jong Choi, San Diego, CA (US); Andrew C. Kummel, San Diego, CA (US); Keith Tatseun Wong, Los Gatos, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 328 days.

(21) Appl. No.: 16/802,290

(22) Filed: Feb. 26, 2020

(65) Prior Publication Data

US 2020/0303183 A1    Sep. 24, 2020

Related U.S. Application Data

(60) Provisional application No. 62/821,153, filed on Mar. 20, 2019.

(51) Int. Cl.
*H01L 21/02*       (2006.01)
*C23C 16/40*       (2006.01)
*C23C 16/455*      (2006.01)

(52) U.S. Cl.
CPC ...... *H01L 21/02186* (2013.01); *C23C 16/405* (2013.01); *C23C 16/45527* (2013.01); *C23C 16/45553* (2013.01); *H01L 21/0228* (2013.01); *H01L 21/02205* (2013.01)

(58) Field of Classification Search
None
See application file for complete search history.

(56) References Cited

U.S. PATENT DOCUMENTS

2018/0010247 A1*   1/2018   Niskanen .......... C23C 16/45553
2018/0350587 A1*  12/2018   Jia ..................... H01L 21/02205

* cited by examiner

*Primary Examiner* — Asok K Sarkar
(74) *Attorney, Agent, or Firm* — Patterson + Sheridan, LLP (57) ABSTRACT

Methods for depositing a metal containing material formed on a certain material of a substrate using an atomic layer deposition process for semiconductor applications are provided. In one example, a method of forming a metal containing material on a substrate comprises pulsing a first gas precursor comprising a metal containing precursor to a surface of a substrate, pulsing a second gas precursor comprising a carboxylic acid to the surface of the substrate, and forming a metal containing material selectively on a first material of the substrate. In another example, a method of forming a metal containing material on a substrate includes selectively forming a metal containing layer on a silicon material or a metal material on a substrate than on an insulating material on the substrate by an atomic layer deposition process by alternatively supplying a metal containing precursor and a water free precursor to the substrate.

15 Claims, 5 Drawing Sheets

HIGH SELECTIVITY ATOMIC LATER DEPOSITION PROCESS

BACKGROUND

Field

Embodiments generally relate to methods for selectively forming a metal containing material on certain locations of a semiconductor substrate. More specifically, embodiments relate to methods for selectively forming a metal containing material on certain locations of a semiconductor substrate by an atomic layer deposition process for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with certain desired materials has become increasingly difficult to satisfy. The conventional selective deposition process often cannot efficiently be confined to designated small areas of the substrate, resulting in undesired materials being formed on undesired locations of the substrate. Thus, deposited materials are generally globally formed across the entire surface of the substrate without selectivity or be deposited on undesired locations of the substrate, thus making the selective deposition processes difficult to achieve and often resulting in cross contamination on the substrate surface.

Thus, there is a need for improved methods for a deposition process suitable for advanced generation of semiconductor applications.

SUMMARY

Methods for depositing a metal containing material formed on a certain material of a substrate using an atomic layer deposition process for semiconductor applications are provided. In one embodiment, a method of forming a metal containing material on a substrate comprises pulsing a first gas precursor comprising a metal containing precursor to a surface of a substrate, pulsing a second gas precursor comprising a carboxylic acid to the surface of the substrate, and forming a metal containing material selectively on a first material of the substrate.

In another embodiment, a method of forming a metal containing material on a substrate includes performing an atomic layer deposition process by alternatively pulsing a first and a second gas precursor to a surface of a substrate, the surface of the substrate comprising a first and a second material, wherein the first gas precursor comprises a metal containing gas and the second gas precursor comprises a water free precursor, and selectively forming a metal containing material on the first material of the substrate.

In yet another embodiment, a method of forming a metal containing material on a substrate includes selectively forming a metal containing layer on a silicon material or a metal material on a substrate than on an insulating material on the substrate by an atomic layer deposition process by alternatively supplying a metal containing precursor and a water free precursor to the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing a metal containing material at a certain location on a structure formed on the substrate are provided. The structure may include a back-end structure, front-end structure, interconnection structure, passivation structure, fin structure, a gate structure, a contact structure, or any suitable structure in semiconductor devices. In one example, an atomic layer deposition process may be utilized to form a metal containing material on a certain surface, e.g., selectively form a certain type of a material on a substrate comprising two or more different surfaces made from different materials. In one example, a titanium (Ti) containing material is formed by an atomic layer deposition (ALD) process. The titanium (Ti) containing material ALD deposition process utilizes a water free precursor to form the titanium (Ti) containing material with selected precursors. For example, the precursors selected to form the titanium (Ti) containing material comprises at least a Ti containing gas precursor and an acid agent at a selected process temperature greater than 150 degrees Celsius.

Figure 1:
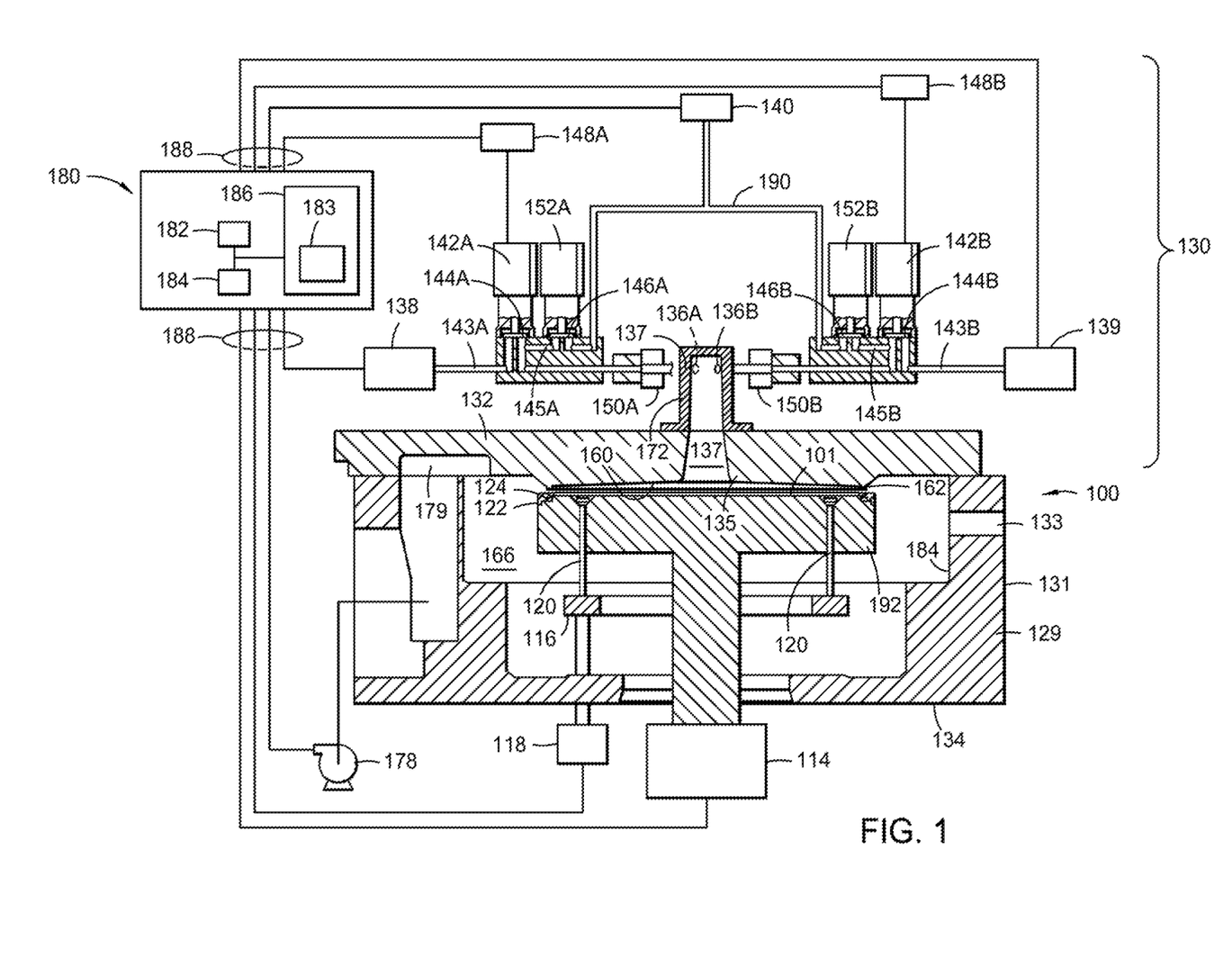
FIG. 1 depicts an apparatus that may be utilized to perform an atomic layer deposition (ALD) process.

FIG. 1 is a schematic cross-sectional view of one embodiment of an atomic layer deposition (ALD) processing chamber 100. The ALD processing chamber 100 includes a gas delivery apparatus 130 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 100 may also be adapted for other deposition techniques along with lithography processes.

The chamber 100 comprises a chamber body 129 having sidewalls 131 and a bottom 134. A slit valve tunnel 133 formed through the chamber body 129 provides access for a robot (not shown) to deliver and retrieve a substrate 101, such as a 200 mm, 300 mm or 450 mm semiconductor substrate or a glass substrate, from the chamber 100.

A substrate support 192 is disposed in the chamber 100 and supports the substrate 101 during processing. The substrate support 192 is mounted to a lift 114 to raise and lower the substrate support 192 and the substrate 101 disposed thereon. A lift plate 116 is connected to a lift plate actuator 118 that controls the elevation of the lift plate 116. The lift plate 116 may be raised and lowered to raise and lower pins 120 movably disposed through the substrate support 192. The pins 120 are utilized to raise and lower the substrate 101 over the surface of the substrate support 192. The substrate support 192 may include a vacuum chuck, an electrostatic chuck, or a clamp ring for securing the substrate 101 to the surface of the substrate support 192 during processing.

The substrate support 192 may be heated to heat the substrate 101 disposed thereon. For example, the substrate support 192 may be heated using an embedded heating element, such as a resistive heater, or may be heated using radiant heat, such as heating lamps disposed above the substrate support 192. A purge ring 122 may be disposed on the substrate support 192 to define a purge channel 124 which provides a purge gas to a peripheral portion of the substrate 101 to prevent deposition thereon.

A gas delivery apparatus 130 is disposed at an upper portion of the chamber body 129 to provide a gas, such as a process gas and/or a purge gas, to the chamber 100. A pumping system 178 is in communication with a pumping channel 179 to evacuate any desired gases from the chamber 100 and to help maintain a desired pressure or a desired pressure range inside a pumping zone 166 of the chamber 100.

In one embodiment, the gas delivery apparatus 130 comprises a chamber lid 132. The chamber lid 132 includes an expanding channel 137 extending from a central portion of the chamber lid 132 and a bottom surface 160 extending from the expanding channel 137 to a peripheral portion of the chamber lid 132. The bottom surface 160 is sized and shaped to substantially cover the substrate 101 disposed on the substrate support 192. The chamber lid 132 may have a choke 162 at a peripheral portion of the chamber lid 132 adjacent the periphery of the substrate 101. The cap portion 172 includes a portion of the expanding channel 137 and gas inlets 136A, 136B. The expanding channel 137 has gas inlets 136A, 136B to provide gas flows from two similar valves 142A, 142B. The gas flows from the valves 142A, 142B may be provided together and/or separately.

In one configuration, valve 142A and valve 142B are coupled to separate reactant gas sources, but are coupled to the same purge gas source. For example, valve 142A is coupled to a reactant gas source 138 and valve 142B is coupled to reactant gas source 139, which both valves 142A, 142B are coupled to purge a gas source 140. Each valve 142A, 142B includes a delivery line 143A, 143B having a valve seat assembly 144A, 144B and includes a purge line 145A, 145B having a valve seat assembly 146A, 146B. The delivery line 143A, 143B is in communication with the reactant gas source 138, 139 and is in communication with the gas inlet 137A, 137B of the expanding channel 190. The valve seat assembly 144A, 144B of the delivery line 143A, 143B controls the flow of the reactant gas from the reactant gas source 138, 139 to the expanding channel 190. The purge line 145A, 145B is in communication with the purge gas source 140 and intersects the delivery line 143A, 143B downstream of the valve seat assembly 144A, 144B of the delivery line 143A, 143B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 138, 139, the same gas may be used as a carrier gas and a purge gas (i.e., an argon gas may be used as both a carrier gas and a purge gas).

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned as slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume.) Each valve 142A, 142B may be adapted to provide a combined gas flow and/or separate gas flow of the reactant gas from the sources 138, 139 and the purge gas from the source 140. The pulses of the purge gas may be provided by opening and closing a diaphragm of the valve seat assembly 146A of the purge line 145A. The pulses of the reactant gas from the reactant gas source 138 may be provided by opening and closing the valve seat assembly 144A of the delivery line 143A.

A control unit 180 is coupled to the chamber 100 to control processing conditions. The control unit 180 comprises a central processing unit (CPU) 182, support circuitry 184, and memory 186 containing associated control software 183. The control unit 180 may be one of any form of general purpose computer processors that can be used in an industrial setting for controlling various chambers and subprocessors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 100. The control unit 180 may be coupled to another controller that is located adjacent individual chamber components, such as the programmable logic controllers 148A, 148B of the valves 142A, 142B. Bi-directional communications between the control unit 180 and various other components of the chamber 100 are handled through numerous signal cables collectively referred to as signal buses 188, some of which are illustrated in FIG. 1. In addition to the control of process gases and purge gases from gas sources 138, 139, 140 and from the programmable logic controllers 148A, 148B of the valves 142A, 142B, the control unit 180 may be configured to be responsible for automated control of other activities used in substrate processing, such as substrate transport, temperature control, chamber evacuation, among other activities, some of which are described elsewhere herein.

Figure 2:
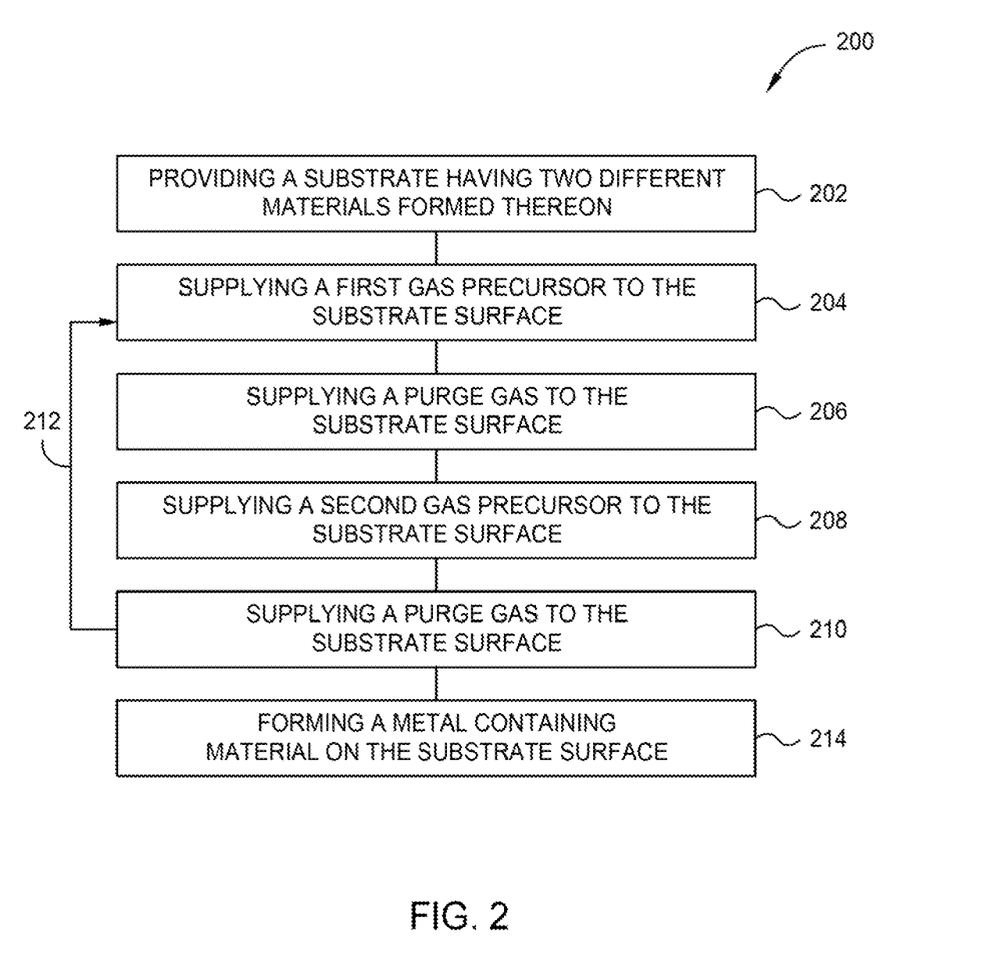
FIG. 2 depicts a flow diagram of an example of a method for selectively forming a metal containing material on certain locations on a substrate.

FIG. 2 is a flow diagram of one embodiment of a process 200 of forming a metal containing material by an atomic layer deposition (ALD) process. Such atomic layer deposition of the process 200 may be performed in the processing chamber 100 depicted in FIG. 1, or other suitable processing chamber. A structure containing the metal containing material formed by the ALD process 200 may be any suitable structure formed on a semiconductor substrate, such as interconnection structure with conductive and non-conductive areas, a fin structure, a gate structure, a contact structure, a front-end structure, a back-end structure or any other suitable structure utilized in semiconductor applications. FIGS. 3A-3F and FIG. 4A-4C are schematic cross-sectional views of portions of a composite substrate corresponding to various stages of the process 200. The process 200 may be utilized to an interconnection structure both conductive and non-conductive areas formed on a substrate so as to form a metal containing material formed on certain locations of the structure with certain materials formed on the substrate.

Figure 3A:
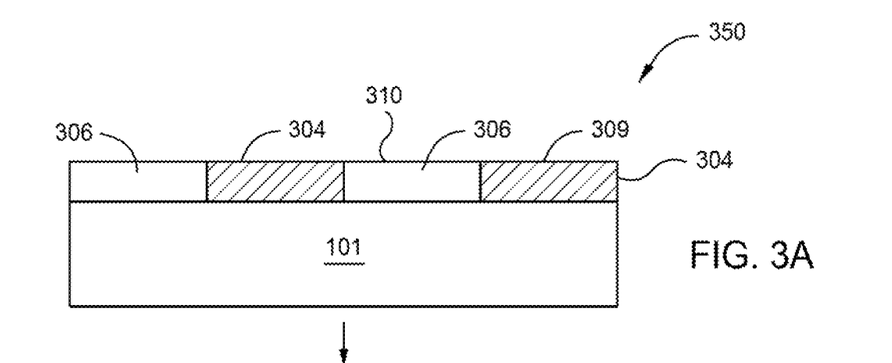
FIGS. 3A-3F depict one embodiment of a sequence for forming a metal containing material selectively on certain locations on the substrate during the manufacturing process according to the process depicted in FIG. 2.

The process 200 begins at operation 202 by providing a substrate, such as the substrate 101, as shown in FIG. 3A. In one embodiment, the substrate 101 may have a structure 350 formed on the substrate 101. In one example, the structure 350 may be utilized for forming semiconductor devices. In the example depicted in FIG. 3A, the structure 350 may include at least two different materials, such as a first material 304 and a second material 306. In one example, the first material 304 may be a silicon material or a metal material and the second material 306 may be an insulating material, such as $SiO_2$, SiON, SiN, SiOC, SiCOH, and the like. In the example wherein the first material 304 is a silicon material, the silicon material of the first material 304 may be the material from the substrate 101. Thus, the substrate 101 may be patterned to form openings that allow the second material 306 to be filled therein. The second material 306 is an insulating material comprising oxide or other suitable materials, such as $SiO_2$, SiON, SiOC, SiCOH or SiN.

In one example, the substrate 101 may include materials selected from a group consisting of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 101 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate. Moreover, the substrate 101 is not limited to any particular size or shape. The substrate 101 may be a circular, polygonal, square, rectangular, curved or otherwise non-circular workpiece, such as a polygonal glass substrate used in the fabrication of flat panel displays.

Although the example depicted in FIG. 3A shown that the structure 350 is formed on the substrate 101, it is noted that there may be further structures formed between the interconnection structure 350 and the substrate 101 as needed. In one example, a front-end structure, such as a gate structure and/or a contact structure may be formed between the structure 350 and the substrate 101 to enable functions of the semiconductor devices.

In one example, the insulating material for the second material 306 included in the structure 350 may be a dielectric material, such as silicon oxide, doped silicon materials, or low-k materials, such as carbon containing materials. Suitable carbon containing materials include amorphous carbon, SiC, SiOC, doped carbon materials or any suitable materials. Suitable examples of the low-k insulating dielectric material include SiO containing materials, SiN containing materials, SiOC containing materials, SiC containing materials, carbon based materials, or other suitable materials.

The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed.

At operation 204, a first pulse of a first gas precursor is supplied onto the substrate surface in a processing chamber, such as the processing chamber 100 depicted in FIG. 1, to form a first monolayer 308a selectively on the first material 304 of the substrate 101, as shown in FIG. 3A. The first monolayer 308a may be a part of the metal containing material eventually desired to be formed on the substrate 101. The first monolayer 308a is selected to predominantly form the first material 304 (e.g., a silicon material or a metal material) with compatible film qualities and characteristics to the first monolayer 308a, but not to the second material 306 (e.g., an insulating material), so that the first monolayer 308a may be selectively formed on the surface 309 of the first material 304 of the substrate 101, rather than globally formed across the substrate 101, including the surfaces 310 of the second material 306.

The atomic layer deposition (ALD) process as performed for process 200 is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the metal containing material formed by the ALD process depends on the number of the reaction cycles.

The first reaction of the operation 204 provides the first monolayer 308a being absorbed on the first material 304 on the substrate 101 and a second reaction (e.g., which will be performed at operation 208) provide a second monolayer being absorbed on the first monolayer 308a. As the ALD process is very sensitive to the substrate conditions, the first monolayer 308a that forms on the first material 304 where the silicon material (or metal material) is located may not be able to adhere or form on the oxide material, such as the insulating material from the second material 306, formed on the substrate 101. Thus, by utilizing the differences of the material properties at different locations from the substrate, a selective ALD deposition process is enabled to allow the precursors from the ALD deposition process to nucleate and grow on the nucleate sites provided from the silicon elements (or metal elements) from the first material 304, while inert to the surfaces 310 from oxide material from the second material 306.

In one example, the first gas precursor is a metal containing precursor, which is utilized to provide metal elements to form a metal containing material on the substrate 101. Thus, the first monolayer 308a as formed on the first material 304 is a metal material. The metal elements sourced from the first gas precursors are selected to be easily absorbed and attached to the silicon elements (or metal elements) from the first material 304 from the substrate 101. Thus, the selective ALD deposition process selectively grow the first monolayer 308a comprising metal elements only on designated sites, i.e., the silicon materials or metal materials, from the first material 304, without forming on the non-silicon or non-metal material (e.g., oxide material or insulating material) from the second material 306.

During the ALD deposition process, a pulse of a first gas precursor (e.g., a first reactant) is supplied into the processing chamber, such as the processing chamber 100 depicted in FIG. 1, to form the first monolayer 308a. It is believed that the first monolayer 308a is absorbed onto the first material 304 by a chemical reaction that allows the metal atoms from the first monolayer 308a to be securely adhered on the silicon or metal atoms from the first material 304. Since the metal elements from the first monolayer 308a may have chemical properties different from the oxide material from the second material 306, the molecules from the second material 306 may not be able to successfully adhere the metal atoms from the first monolayer 308a, thus selectively allowing the metal atoms from the first monolayer 308a to be adhered on the silicon or metal atoms of the first material 304. In this way, the subsequently formed second monolayer (e.g., 312a shown in FIG. 3C) may selectively deposit on the first monolayer 308a, thus enabling a continuing selective deposition of an ALD process. In some examples, it is noted that the Ti precursor may physisorbs on second material 306 without undergoing a chemical reaction. This non-selective physisorption is subsequently removed by controlling the substrate temperature and purge time at operation 206 before co-reactant dose at operation 208.

In one example, the first gas precursor (e.g., a first reactant) utilized in the first pulse of reaction to form the first monolayer 308a includes metal containing gas precursor, such as a metal alkoxide, particularly, such as a titanium (Ti) containing gas precursor or hafnium (Hf) containing gas precursor. Suitable examples of the titanium (Ti) containing gas precursor include titanium (IV) isopropoxide (Ti(OCH(CH$_3$)$_2$)$_4$, titanium n-butoxide (n-C$_4$H$_9$O)$_4$Ti), titanium t-butoxide (t-C$_4$H$_9$O)$_3$Ti), titanium chloride (TiCl$_4$), tetrakis(diethylamido)titanium(IV) and tetrakis(dimethylamido) titanium(IV), and the like. In one example, the titanium (Ti) containing gas precursor is titanium (IV) isopropoxide (Ti(OCH(CH$_3$)$_2$)$_4$. Suitable examples of the hafnium (Hf) containing gas precursor include Hf(OCH(CH$_3$)$_2$)$_4$, (t-C$_4$H$_9$O)$_3$Hf, is(cyclopentadienyl) hafnium (IV) dimethyl (Cp$_2$HfMe$_2$), tetrakis(diethylamido) hafnium (TDEAH) and tris(dimethylamido) silane (Tris-DMAS).

Strong adherence of atoms in each layers and absorbability of the layers of atoms onto the surface of substrate provide compact and secured bonding structures so as to render a film property with a high film density and high selectivity (as compared to a chemical vapor deposition process).

The first pulse of reaction sourced from the first gas precursor at operation 204 lasts for a predetermined time interval. The term pulse as used herein refers to a dose of material injected into the process chamber. During pulsing of the first gas precursor, several process parameters are also regulated. In one embodiment, the process pressure is controlled at between about 0.01 Torr and about 20 Torr.

The processing temperature is maintained greater than 150 degrees Celsius, such as between about 150 degrees Celsius and about 300 degrees Celsius, such as about 250 degrees Celsius. It is believed that the relatively higher deposition temperature, such as greater than 150 degrees Celsius, may assist reacting the metal compound from the first gas precursor efficiently so as to assist adsorption of the metal elements onto the substrate surface. Furthermore, the relatively high deposition temperature, such as greater than 150 degrees Celsius, can assist the metal containing precursor, such as the titanium (IV) isopropoxide (Ti(OCH(CH$_3$)$_2$)$_4$, to react with a surface having a certain type of the terminal group (e.g., Si—H) from the surface 309, thus rendering a selective deposition process. Furthermore, the relatively high deposition temperature, such as greater than 150 degrees Celsius, can assist with desorption of physically adsorbed metal containing precursor from surface 310. It is believed that deposition temperatures greater than 150 degrees Celsius but below 300 degrees Celsius may prevent non-selective decomposition of the metal containing precursor which would lead to deposition on all surfaces.

Figure 3B:
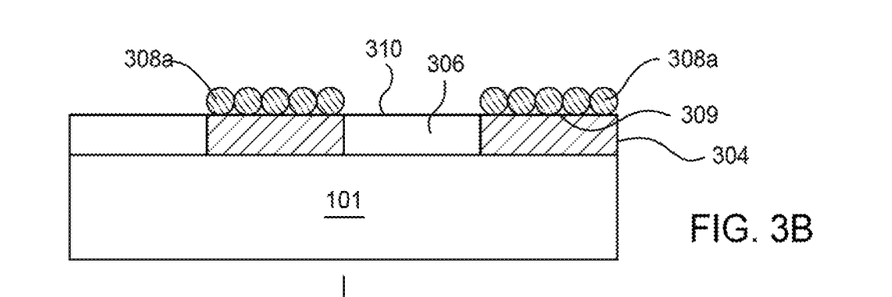
Figure 4A:
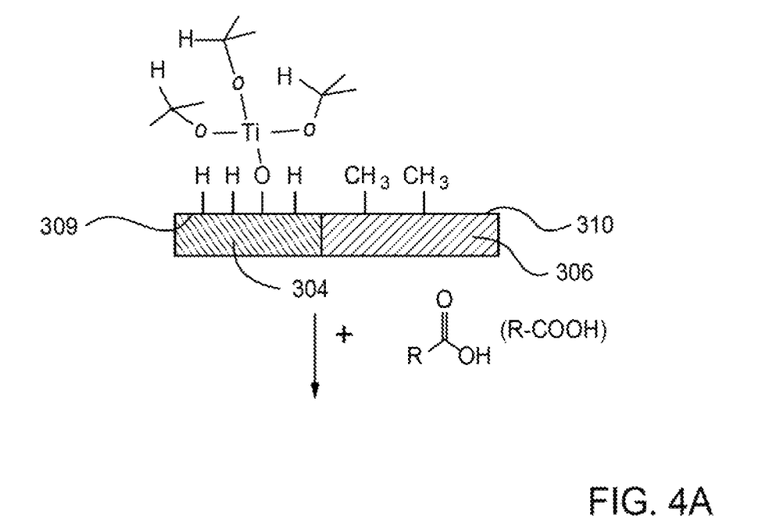
FIGS. 4A-4C depict a process reaction occurred during the method of FIG. 2.

For example, in the example depicted in FIG. 4A wherein the first gas precursor is titanium (IV) isopropoxide (Ti(OCH(CH$_3$)$_2$)$_4$ and while pulsing the first gas precursor onto the substrate surface, the first gas precursor reacts under the relatively high temperature environment, undergoing ligand exchange with the reactive surface (e.g., such as Si—H terminal surface) from the surface 309 of the first material 304. Thus, the reactive titanium (IV) isopropoxide (Ti(OCH(CH$_3$)$_2$)$_4$ is attached via oxygen to the first material 304, forming the first monolayer 308a, as shown in FIG. 3B with a byproduct, such as propane, desorbed to the gas phase. In contrast, the surface 310 of the second material 306, which often has an alkyl terminal group (e.g., —C$_x$H$_y$) sourced from the ambient or from the film bonding structure, would not actively react (e.g., or relatively inert to) with the titanium terminal group, thus avoiding the first monolayer 308a being formed on the second material 306. Thus, by selecting different temperature range of the process with the desired type of the first gas precursor, a selective deposition process is enabled and enhanced.

Thus, the first monolayer 308a shown in FIG. 3B may include Ti elements, after the first pulse of the first gas precursor. Each pulse of the first reaction may deposit a layer of the first monolayer 308a having a thickness between about 1 Å and about 5 Å.

At operation 206, after pulsing of the first gas precursor, a purge gas may be supplied to the substrate surface. Between each pulse of the first precursor or/and a second precursor (which will be later performed at operation 208) and/or a reactive gaseous species, a purge gas or a purge gas mixture, such as a nitrogen gas, an inert gas (e.g., He or Ar) or the like, may be pulsed into the processing chamber in between each or multiple pulses of the first precursor or/and a second precursor and/or a reactive gaseous species to remove the by-products, impurities or residual precursor gas mixture which is unreacted/non-absorbed by the substrate surface (e.g., unreacted impurities from the reactant gas mixture or others) so they can be pumped out of the processing chamber.

It is that the time of the purging at operation 206 may impact on the removal efficiency of the amount of the residuals left on the second material 306. Thus, a sufficient time period for the purge process at operation 206 is desired so as to remove the surface residuals or byproduct from the substrate surface.

The process parameters controlled during the operation 206 for pulsing the purge gas and/or purge gas mixture may be controlled similar to or the same as the pulsing of the first gas mixture at operation 204.

Figure 3C:
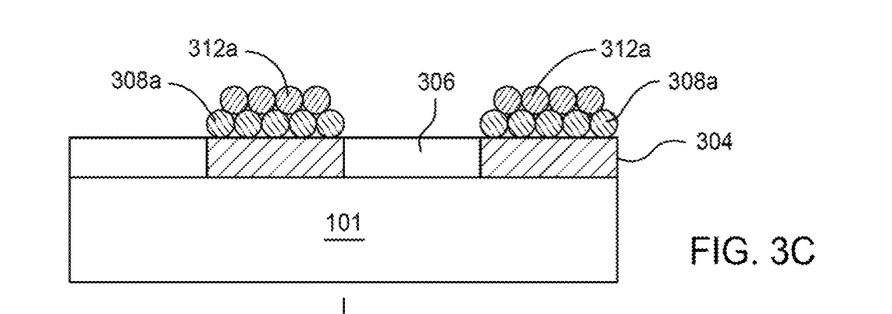

At operation 208, after the first reaction and a pump/purge process, a second gas precursor (e.g., a second reactant or called a co-reactant) is supplied to initiate a second reaction, forming a second monolayer 312a on the first monolayer 308a, as shown in FIG. 3C. The second precursor may be supplied with or without additional reactive gaseous species as needed. The second precursor is a gas precursor comprising a carboxylic acid (e.g., R—COOH, R stands for any suitable molecule). Suitable examples of the carboxylic acid include acetic acid ($CH_3COOH$), benzoic acid ($C_6H_5COOH$), formic acid (HCOOH), chloroacetic acid ($CH_2ClCOOH$), dichloroacetic acid ($CHCl_2COOH$), oxalic acid ($HO_2CCOOH$), trichloroacetic acid ($CCl_3CO_2H$), and trifluoroacetic acid ($CF_3COOH$). The second gas precursor is a water free co-reactant so as to avoid breakdown of self-assembled monolayer, which often occurred in a conventional chemical reaction. In one example, the carboxylic acid selected for the second gas precursor is acetic acid ($CH_3COOH$). The pulse of the second gas precursor initiates a second reaction which may deposit the second monolayer 312a having a thickness between about 1 Å and about 3 Å.

Figure 4B:
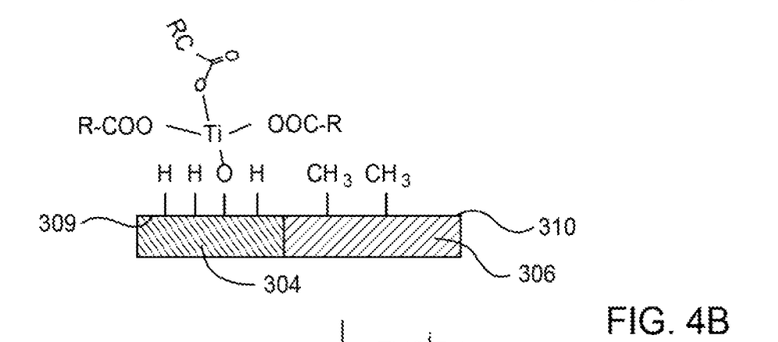

It is believed that acetic acid ($CH_3COOH$) may be reactive towards the adsorbed metal precursor ligands due to the relatively high processing temperature present during the reaction. As a result, the acidic hydrogen undergoes ligand exchange with the adsorbed Ti active species from the first monolayer, 308a. As shown in FIG. 4B, the thermal energy assists reacting the carboxylic acid with the isopropoxide terminals of the Ti complex agent resulting in —OC(=O)R termination of the Ti and isopropanol desorbed to the gas phase. In the example depicted in FIG. 4B, three bonding branches from the Ti complex agent are bonded with the oxygen terminals (—OC(=O)R) from the carboxylic acid attached thereto. It is noted that the degree of decomposition of the carboxylic acid and the reaction to the Ti complex agent from the first monolayer 308a may be in any form or may be controlled by different temperature settings, pulse dose ratio, pulse frequency, or pulse dose concentration as needed. Thus, after the oxygen terminals (—OC(=O)R) from the carboxylic acid are attached to the Ti complex agent, a Ti and oxide containing material (e.g., TiO2) is selectively formed on the first material 304.

The second reaction lasts for a predetermined time interval to form the second monolayer 312a, as shown in FIG. 3C. During pulsing of the second precursor comprising carboxylic acid, a reactive gaseous specie may be supplied simultaneously with, alternatively, or sequentially with the second precursor (e.g., the Si containing precursor as one example) as needed prior to, during or after the pulsing of the second gas precursor.

During supplying of the second precursor with or without the reactive gaseous species (e.g., the reactive gaseous species supplied after the first precursor), several process parameters are also regulated. In one embodiment, the process pressure is controlled at between about 0.01 Torr and about 20 Torr.

The processing temperature is maintained greater than 150 degrees Celsius, such as between about 150 degrees Celsius and about 300 degrees Celsius, such as about 250 degrees Celsius. It is believed that the relatively high deposition temperature, such as greater than 150 degrees Celsius, may assist reacting the carboxylic acid with adsorbed metal ligands so as to assist adsorption of the oxygen elements onto the substrate surface, thus rendering a selective deposition process.

Thus, the first monolayer 308a and the second monolayer 312a as shown in FIG. 3C may include Ti elements as well as oxygen elements, after the second pulse of the second precursor.

In one example, the dose concentration and/or the dose pulse numbers may be varied between the first gas precursor and the second gas precursor supplied at operation 204 and 208. In one example, the first gas precursor is pulsed at a dosing concentration greater than the second gas precursor in the respective operation 204, 208. For example, approximately 20 doses/pulses of Ti containing gas are performed for each cycle of the deposition at operation 204 while approximately 1 dose/pulse of carboxylic acid for each cycle of the deposition at operation 208. Thus, the dose concentration/gas concentration ratio between the Ti containing gas and the carboxylic acid between each cycle of the operation 204 and 208 is controlled between about 15:1 to about 30:1, for example about 20:1.

At operation 210, after pulsing of the second gas precursor, a purge gas may be supplied to the substrate surface. Between each pulse of the first precursor or/and a second precursor and/or a reactive gaseous species, a purge gas or a purge gas mixture, such as a nitrogen gas, an inert gas (e.g., He or Ar) or the like, may be pulsed into the processing chamber in between each or multiple pulses of the first precursor or/and a second precursor and/or a reactive gaseous species to remove the by-products, impurities or residual precursor gas mixture which is unreacted/non-absorbed by the substrate surface (e.g., unreacted impurities from the reactant gas mixture or others) so they can be pumped out of the processing chamber.

The process parameters controlled during the operation 210 for pulsing the purge gas and/or purge gas mixture may be controlled similar to or the same as the pulsing of the first gas precursor or the second gas precursor at operation 204 and 208, respectively.

Figure 3D:
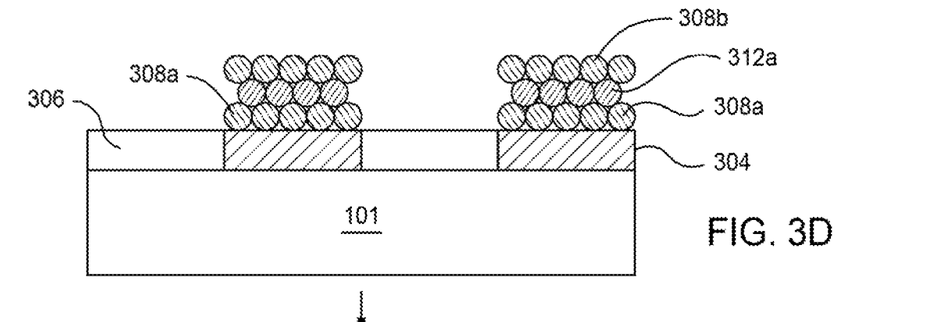
Figure 3E:
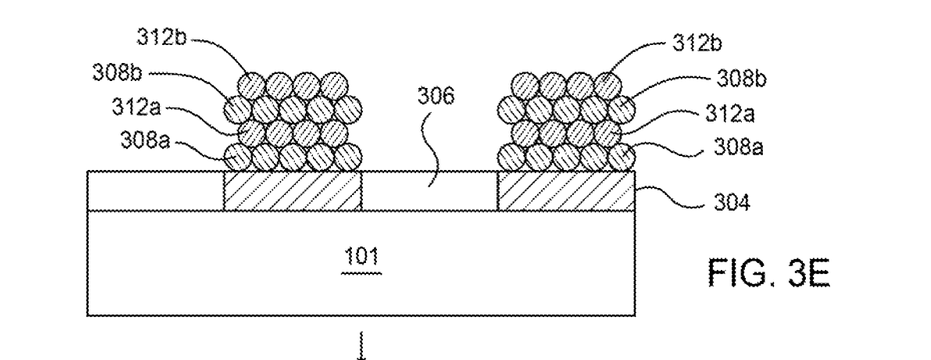
Figure 3F:
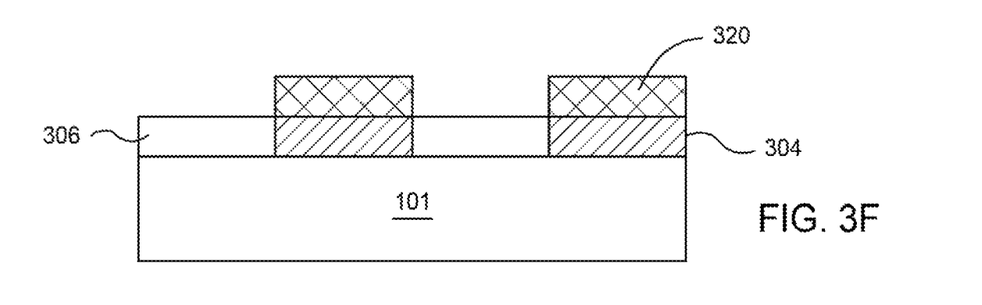

It is noted that the first reaction at operation 204 and the second reaction at operation 208 (and the purge processes at operation 206 and 210) may be repeatedly performed, as indicated by the loop 212, forming an additional first monolayer 308b, as shown in FIG. 3D and yet another additional second monolayer 312b, as shown in FIG. 3E, until a desired thickness of the overall metal containing layer 320 is reached, as shown in FIG. 3F. It is noted that the element/atom scale shown in in FIGS. 3B-3E is exaggerated for ease of explanation.

Figure 4C:
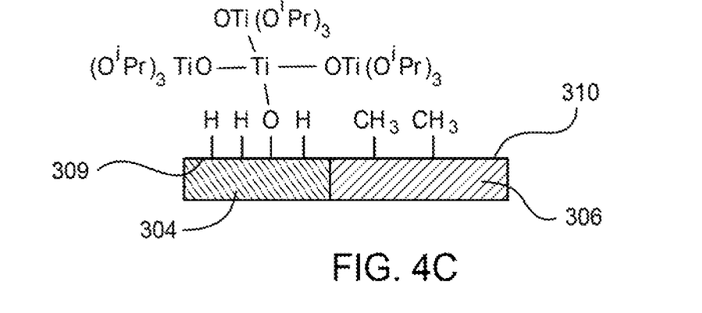

Furthermore, for the bonding mechanism during the second cycle of operation 204 and 208, a second loop of providing the first gas precursor (performed at operation 204) may supply a second round of the Ti containing gas to the substrate surface. As discussed above, the relatively weak bonding structure from the —OC(=O)R bonding may be reacted, as shown in FIG. 4C, with the ligands from the Ti complex, allowing additional Ti terminal to be attached to the oxygen elements, thus forming the desired $TiO_2$ on the first material 304, as shown in FIG. 4C.

At operation 214, as discussed above, when a desired thickness (e.g., after a predetermined number of cycles of operations 204 to 210) is reached, the metal containing layer 320 is selectively formed on the first material 304, as shown in FIG. 3F. The metal containing layer 320 has a thickness having a range from 10 Å and about 100 Å. As discussed above, based on the number of the cycles of the selected operations, the composition of the resultant metal containing layer 320, such as a $TiO_2$ layer, may be varied. For example, the metal containing layer 320 may be a Ti rich or oxygen rich $TiO_2$ layer as determined by the different selection of pulses, doses, gas concentration provided during each loop or each cycle of the deposition process.

Thus, a selective deposition process is provided to form a metal containing layer on different surfaces, e.g., different portions, of a substrate by a selective ALD process. Thus, a structure with desired different type of materials formed on different locations of the substrate may be obtained.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a metal containing material on a substrate comprising:
   heating a substrate to a temperature in a range from about 150 degrees Celsius to about 300 degrees Celsius during a thermal atomic layer deposition (ALD) process;
   performing the thermal ALD process comprising two or more ALD cycles, each ALD cycle comprising:
   pulsing a first gas precursor comprising a metal containing precursor to a surface of the substrate, wherein the metal containing precursor is at least one of titanium (IV) isopropoxide ($Ti(OCH(CH_3)_2)_4$, titanium n-butoxide ($n-C_4H_9O)_4Ti$), and titanium t-butoxide ($t-C_4H_9O)_3Ti$), and wherein a first portion of the surface is a hydrogen-terminated surface and a second portion of the surface is an alkyl-terminated surface; then
   supplying a purge gas to the surface of the substrate; then
   pulsing a second gas precursor comprising a carboxylic acid to the surface of the substrate, wherein the carboxylic acid is free of water; then
   supplying a purge gas to the surface of the substrate; and
   forming a metal containing material selectively on the first portion of the surface while maintaining the second portion of the surface free, or substantially free, of the metal.

2. The method of claim 1, wherein the first and the second gas precursors are alternatively supplied.

3. The method of claim 1, wherein the substrate comprises a second material different from the first material.

4. The method of claim 3, wherein the first material is a silicon material or a metal material.

5. The method of claim 4, wherein the second material is an insulating material.

6. The method of claim 5, wherein the insulating material is at least one of $SiO_2$, $SiON$, $SiN$, $SiOC$ and $SiCOH$.

7. The method of claim 1, wherein the carboxylic acid is at least one of acetic acid ($CH_3COOH$), benzoic acid ($C_6H_5COOH$), formic acid ($HCOOH$), chloroacetic acid ($CH_2ClCOOH$), dichloroacetic acid ($CHCl_2COOH$), oxalic acid ($HO_2CCOOH$), trichloroacetic acid ($CCl_3CO_2H$), and trifluoroacetic acid ($CF_3COOH$).

8. The method of claim 1, wherein the metal containing material is a TiO layer.

9. The method of claim 1, further comprising:
   controlling the process temperature to greater than 150 degrees Celsius when forming the metal containing material.

10. The method of claim 1, wherein the first gas precursor is pulsed at a greater dosing concentration greater than the second gas precursor.

11. The method of claim 1, a ratio of a dose concentration of the first gas precursor to the second gas precursor is controlled between about 15:1 to about 30:1.

12. A method of forming a metal containing material on a substrate comprising:
   heating a substrate to a temperature in a range from about 150 degrees Celsius to about 300 degrees Celsius during a thermal atomic layer deposition (ALD) process;
   performing the thermal ALD process by alternatively pulsing a first and a second gas precursor to a surface of a substrate, separated by supplying pulses of a purge gas to the substrate, the surface of the substrate comprising a first and a second material, wherein the first material of the surface is a hydrogen-terminated surface and a second material of the surface is an alkyl-terminated surface, wherein the first gas precursor comprises a metal containing gas and the second gas precursor comprises a water free precursor, and wherein the metal containing gas is at least one of titanium (IV) isopropoxide ($Ti(OCH(CH_3)_2)_4$, titanium n-butoxide ($n-C_4H_9O)_4Ti$), and titanium t-butoxide ($t-C_4H_9O)_3Ti$); and
   selectively forming a metal containing material on the first material of the substrate while maintaining the second material of the surface substantially free of the metal.

13. The method of claim 12, further comprising:
   maintaining a substrate temperature at greater than 150 degrees Celsius while performing the atomic layer deposition process.

14. The method of claim 12, wherein the water free precursor is carboxylic acid.

15. A method of forming a metal containing material on a substrate comprising:
   heating a substrate to a temperature in a range from about 150 degrees Celsius to about 300 degrees Celsius during a thermal atomic layer deposition (ALD) process
   selectively forming a metal containing layer on a silicon material or a metal material on a substrate than on an insulating material on the substrate by the thermal ALD process by alternatively supplying a metal containing precursor and a water free precursor to the substrate, separated by supplying pulses of a purge gas to the substrate, wherein the metal containing precursor is at least one of titanium (IV) isopropoxide ($Ti(OCH(CH_3)_2)_4$, titanium n-butoxide ($n-C_4H_9O)_4Ti$), and titanium t-butoxide ($t-C_4H_9O)_3Ti$); and
   forming a metal containing material selectively on the first material of the surface while maintaining the second material of the surface free, or substantially free, of the metal wherein the first material of the surface is a hydrogen-terminated surface and a second material of the surface is an alkyl-terminated surface.

* * * * *